United States Patent
Chong et al.

(10) Patent No.: US 7,435,913 B2
(45) Date of Patent: *Oct. 14, 2008

(54) SLANTED VIAS FOR ELECTRICAL CIRCUITS ON CIRCUIT BOARDS AND OTHER SUBSTRATES

(75) Inventors: Chin Hui Chong, Singapore (SG); Choon Kuan Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/475,479

(22) Filed: Jun. 26, 2006

(65) Prior Publication Data

US 2006/0240687 A1    Oct. 26, 2006

Related U.S. Application Data

(63) Continuation of application No. 10/927,760, filed on Aug. 27, 2004, now Pat. No. 7,083,425.

(30) Foreign Application Priority Data

Aug. 27, 2004  (SG)  .............................. 200405514-1

(51) Int. Cl.
*H01R 12/04* (2006.01)
*H05K 1/00* (2006.01)

(52) U.S. Cl. ........................................ 174/262; 174/260
(58) Field of Classification Search ................. 174/262, 174/263, 264, 265, 266; 361/792, 793, 794, 361/795

See application file for complete search history.

(56) References Cited

U.S. PATENT DOCUMENTS 2,821,959 A    2/1958    Franz
3,006,318 A    10/1961   Monroe, Jr. et al.
3,345,134 A    10/1967   Heymer et al.
3,865,298 A    2/1975    Allen et al.
4,368,106 A    1/1983    Anthony (Continued)

FOREIGN PATENT DOCUMENTS

EP    0127946    12/1984

(Continued)

OTHER PUBLICATIONS

Search Report and Examination Report for Singapore Application No. 200405514-1, 7 pages, Jul. 22, 2005.

(Continued)

*Primary Examiner*—Ishwar (I. B.) Patel
(74) *Attorney, Agent, or Firm*—Perkins Coie LLP

(57) ABSTRACT

Circuit boards, microelectronic devices, and other apparatuses having slanted vias are disclosed herein. In one embodiment, an apparatus for interconnecting electronic components includes a dielectric portion having a first surface and a second surface. A first terminal is disposed on the first surface of the dielectric portion for connection to a first electronic component. A second terminal is disposed on the second surface of the dielectric portion for connection to a second electronic component. The apparatus further includes a passage extending through the dielectric portion along a longitudinal axis oriented at an oblique angle relative to the first surface. The passage is at least partially filled with conductive material electrically connecting the first terminal to the second terminal.

14 Claims, 3 Drawing Sheets

U.S. PATENT DOCUMENTS

| | | | |
|---|---|---|---|
| 4,534,100 A | 8/1985 | Lane | |
| 4,608,480 A | 8/1986 | Bizot et al. | |
| 4,614,427 A | 9/1986 | Koizumi et al. | |
| 4,660,063 A | 4/1987 | Anthony | |
| 4,756,765 A | 7/1988 | Woodroffe | |
| 4,768,291 A | 9/1988 | Palmer | |
| 4,959,705 A | 9/1990 | Lemnios et al. | |
| 4,964,212 A | 10/1990 | Deroux-Dauphin et al. | |
| 4,984,597 A | 1/1991 | McConnell et al. | |
| 5,024,966 A | 6/1991 | Dietrich et al. | |
| 5,026,964 A | 6/1991 | Somers et al. | |
| 5,027,184 A | 6/1991 | Soclof | |
| 5,037,782 A | 8/1991 | Nakamura et al. | |
| 5,123,902 A | 6/1992 | Muller et al. | |
| 5,145,099 A | 9/1992 | Wood et al. | |
| 5,158,911 A | 10/1992 | Quentin et al. | |
| 5,233,448 A | 8/1993 | Wu et al. | |
| 5,289,631 A | 3/1994 | Koopman et al. | |
| 5,292,686 A | 3/1994 | Riley et al. | |
| 5,294,568 A | 3/1994 | McNeilly et al. | |
| 5,378,312 A | 1/1995 | Gifford et al. | |
| 5,402,435 A | 3/1995 | Shiono et al. | |
| 5,406,630 A | 4/1995 | Piosenka et al. | |
| 5,424,573 A | 6/1995 | Kato et al. | |
| 5,447,871 A | 9/1995 | Goldstein | |
| 5,464,960 A | 11/1995 | Hall et al. | |
| 5,496,755 A | 3/1996 | Bayraktaroglu | |
| 5,518,956 A | 5/1996 | Liu et al. | |
| 5,585,308 A | 12/1996 | Sardella | |
| 5,585,675 A * | 12/1996 | Knopf | 257/774 |
| 5,614,743 A | 3/1997 | Mochizuki et al. | |
| 5,627,106 A | 5/1997 | Hsu et al. | |
| 5,646,067 A | 7/1997 | Gaul | |
| 5,654,221 A | 8/1997 | Cronin et al. | |
| 5,673,846 A | 10/1997 | Gruber | |
| 5,718,791 A | 2/1998 | Spengler et al. | |
| 5,723,904 A | 3/1998 | Shiga et al. | |
| 5,771,158 A | 6/1998 | Yamagishi et al. | |
| 5,773,359 A | 6/1998 | Mitchell et al. | |
| 5,776,824 A | 7/1998 | Farnworth et al. | |
| 5,807,439 A | 9/1998 | Akatsu et al. | |
| 5,811,799 A | 9/1998 | Wu | |
| 5,821,532 A | 10/1998 | Beaman et al. | |
| 5,825,080 A | 10/1998 | Imaoka et al. | |
| 5,826,628 A | 10/1998 | Hamilton | |
| 5,851,845 A | 12/1998 | Wood et al. | |
| 5,857,963 A | 1/1999 | Pelchy et al. | |
| 5,861,654 A | 1/1999 | Johnson | |
| 5,893,828 A | 4/1999 | Uram | |
| 5,904,499 A | 5/1999 | Pace | |
| 5,998,292 A | 12/1999 | Black et al. | |
| 6,004,867 A | 12/1999 | Kim et al. | |
| 6,008,070 A | 12/1999 | Farnworth | |
| 6,080,291 A | 6/2000 | Woodruff et al. | |
| 6,097,087 A | 8/2000 | Farnworth et al. | |
| 6,103,547 A | 8/2000 | Corisis et al. | |
| 6,107,180 A | 8/2000 | Munroe et al. | |
| 6,107,679 A | 8/2000 | Noguchi et al. | |
| 6,110,825 A | 8/2000 | Mastromatteo et al. | |
| 6,114,240 A | 9/2000 | Akram et al. | |
| 6,124,634 A | 9/2000 | Akram et al. | |
| 6,130,141 A | 10/2000 | Degani et al. | |
| 6,133,622 A | 10/2000 | Corisis et al. | |
| 6,137,182 A | 10/2000 | Hause et al. | |
| 6,140,604 A | 10/2000 | Somers et al. | |
| 6,143,588 A | 11/2000 | Glenn | |
| 6,148,509 A | 11/2000 | Schoenfeld et al. | |
| 6,159,764 A | 12/2000 | Kinsman et al. | |
| 6,184,465 B1 | 2/2001 | Corisis | |
| 6,187,615 B1 | 2/2001 | Kim et al. | |
| 6,191,487 B1 * | 2/2001 | Rodenbeck et al. | 257/778 |
| 6,222,270 B1 | 4/2001 | Lee | |
| 6,228,687 B1 | 5/2001 | Akram et al. | |
| 6,229,202 B1 | 5/2001 | Corisis | |
| 6,235,552 B1 | 5/2001 | Kwon et al. | |
| 6,246,108 B1 | 6/2001 | Corisis et al. | |
| 6,252,300 B1 | 6/2001 | Hsuan et al. | |
| 6,268,114 B1 | 7/2001 | Wen et al. | |
| 6,271,580 B1 | 8/2001 | Corisis | |
| 6,277,757 B1 | 8/2001 | Lin et al. | |
| 6,291,894 B1 | 9/2001 | Farnworth et al. | |
| 6,294,837 B1 | 9/2001 | Akram et al. | |
| 6,326,689 B1 | 12/2001 | Thomas | |
| 6,326,697 B1 | 12/2001 | Farnworth | |
| 6,341,009 B1 | 1/2002 | O'Connor et al. | |
| 6,344,976 B1 | 2/2002 | Schoenfeld et al. | |
| 6,359,328 B1 | 3/2002 | Dubin | |
| 6,372,548 B2 | 4/2002 | Bessho et al. | |
| 6,391,770 B2 | 5/2002 | Kosaki et al. | |
| 6,437,441 B1 | 8/2002 | Yamamoto et al. | |
| 6,441,487 B2 | 8/2002 | Elenius et al. | |
| 6,452,270 B1 | 9/2002 | Huang et al. | |
| 6,459,039 B1 * | 10/2002 | Bezama et al. | 174/359 |
| 6,468,889 B1 | 10/2002 | Iacoponi et al. | |
| 6,486,083 B1 | 11/2002 | Mizuno et al. | |
| 6,486,549 B1 | 11/2002 | Chiang et al. | |
| 6,534,863 B2 | 3/2003 | Walker et al. | |
| 6,545,563 B1 | 4/2003 | Smith | |
| 6,555,782 B2 | 4/2003 | Isaji et al. | |
| 6,560,047 B2 | 5/2003 | Choi et al. | |
| 6,569,711 B1 | 5/2003 | Susko et al. | |
| 6,569,777 B1 | 5/2003 | Hsu et al. | |
| 6,576,531 B2 | 6/2003 | Peng et al. | |
| 6,580,174 B2 | 6/2003 | McCormick et al. | |
| 6,593,644 B2 | 7/2003 | Chiu et al. | |
| 6,614,033 B2 | 9/2003 | Suguro et al. | |
| 6,620,731 B1 | 9/2003 | Farnworth et al. | |
| 6,638,410 B2 | 10/2003 | Chen et al. | |
| 6,653,236 B2 | 11/2003 | Wai et al. | |
| 6,658,818 B2 | 12/2003 | Kurth et al. | |
| 6,660,622 B2 | 12/2003 | Chen et al. | |
| 6,660,630 B1 | 12/2003 | Chang et al. | |
| 6,667,551 B2 | 12/2003 | Hanaoka et al. | |
| 6,680,459 B2 | 1/2004 | Kanaya et al. | |
| 6,699,787 B2 | 3/2004 | Mashino et al. | |
| 6,703,310 B2 | 3/2004 | Mashino et al. | |
| 6,746,971 B1 | 6/2004 | Ngo et al. | |
| 6,770,958 B2 | 8/2004 | Wang et al. | |
| 6,774,486 B2 | 8/2004 | Kinsman | |
| 6,777,244 B2 | 8/2004 | Pepper et al. | |
| 6,780,749 B2 | 8/2004 | Masumoto et al. | |
| 6,797,616 B2 | 9/2004 | Kinsman | |
| 6,809,421 B1 | 10/2004 | Hayasaka et al. | |
| 6,818,464 B2 | 11/2004 | Heschel | |
| 6,828,175 B2 | 12/2004 | Wood et al. | |
| 6,828,223 B2 | 12/2004 | Chuang | |
| 6,838,377 B2 | 1/2005 | Tonami et al. | |
| 6,856,023 B2 | 2/2005 | Muta et al. | |
| 6,873,054 B2 | 3/2005 | Miyazaw et al. | |
| 6,885,107 B2 | 4/2005 | Kinsman | |
| 6,903,012 B2 | 6/2005 | Geefay et al. | |
| 6,903,442 B2 | 6/2005 | Wood et al. | |
| 6,910,268 B2 | 6/2005 | Miller | |
| 6,916,725 B2 | 7/2005 | Yamaguchi | |
| 6,936,536 B2 | 8/2005 | Sinha | |
| 6,943,056 B2 | 9/2005 | Nemoto et al. | |
| 6,946,325 B2 | 9/2005 | Yean et al. | |
| 6,953,748 B2 | 10/2005 | Yamaguchi | |
| 6,970,775 B2 | 11/2005 | Lederle et al. | |
| 6,982,487 B2 | 1/2006 | Kim et al. | |
| 7,022,609 B2 | 4/2006 | Yamamoto et al. | |
| 7,023,090 B2 | 4/2006 | Huang et al. | |
| 7,029,937 B2 | 4/2006 | Miyazawa et al. | |
| 7,033,927 B2 | 4/2006 | Cohen et al. | |

| Patent/Pub No. | Date | Name |
|---|---|---|
| 7,041,598 B2 | 5/2006 | Sharma |
| 7,045,015 B2 | 5/2006 | Renn et al. |
| 7,083,425 B2 * | 8/2006 | Chong et al. .................. 439/66 |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Myers et al. |
| 7,186,650 B1 | 3/2007 | Dakshina-Murthy |
| 7,190,061 B2 | 3/2007 | Lee et al. |
| 7,199,050 B2 | 4/2007 | Hiatt |
| 7,217,596 B2 | 5/2007 | Cobbley et al. |
| 7,217,888 B2 | 5/2007 | Sunohara et al. |
| 7,232,754 B2 | 6/2007 | Kirby et al. |
| 7,256,073 B2 | 8/2007 | Noma et al. |
| 7,262,134 B2 | 8/2007 | Kirby et al. |
| 7,265,052 B2 | 9/2007 | Sinha |
| 7,271,482 B2 | 9/2007 | Kirby |
| 7,300,857 B2 | 11/2007 | Akram et al. |
| 2002/0005583 A1 | 1/2002 | Harada et al. |
| 2002/0020898 A1 | 2/2002 | Vu et al. |
| 2002/0057468 A1 | 5/2002 | Segawa et al. |
| 2002/0059722 A1 | 5/2002 | Murakami |
| 2002/0094607 A1 | 7/2002 | Gebauer et al. |
| 2002/0096729 A1 | 7/2002 | Tu et al. |
| 2002/0130390 A1 | 9/2002 | Ker et al. |
| 2002/0190371 A1 | 12/2002 | Mashino et al. |
| 2003/0014895 A1 | 1/2003 | Lizotte |
| 2003/0119308 A1 | 6/2003 | Geefay et al. |
| 2003/0216023 A1 | 11/2003 | Wark et al. |
| 2004/0018712 A1 | 1/2004 | Pias et al. |
| 2004/0023447 A1 | 2/2004 | Kirakata et al. |
| 2004/0041261 A1 | 3/2004 | Kinsman |
| 2004/0043607 A1 | 3/2004 | Farnworth et al. |
| 2004/0073607 A1 | 4/2004 | Su et al. |
| 2004/0087441 A1 | 5/2004 | Bock et al. |
| 2004/0137661 A1 | 7/2004 | Murayama |
| 2004/0137701 A1 | 7/2004 | Takao |
| 2004/0159958 A1 | 8/2004 | Funaki |
| 2004/0178491 A1 | 9/2004 | Akram et al. |
| 2004/0180539 A1 | 9/2004 | Yamamoto et al. |
| 2004/0192033 A1 | 9/2004 | Hara |
| 2004/0198033 A1 | 10/2004 | Lee et al. |
| 2004/0198040 A1 | 10/2004 | Geefay et al. |
| 2004/0219763 A1 | 11/2004 | Kim et al. |
| 2004/0222082 A1 | 11/2004 | Gopairaja et al. |
| 2004/0255258 A1 | 12/2004 | Li |
| 2004/0262753 A1 | 12/2004 | Kashiwazaki |
| 2005/0026443 A1 | 2/2005 | Goo et al. |
| 2005/0037608 A1 | 2/2005 | Andricacos et al. |
| 2005/0046002 A1 | 3/2005 | Lee et al. |
| 2005/0064707 A1 | 3/2005 | Sinha |
| 2005/0069782 A1 | 3/2005 | Elenius et al. |
| 2005/0104228 A1 | 5/2005 | Rigg et al. |
| 2005/0106834 A1 | 5/2005 | Andry et al. |
| 2005/0110095 A1 | 5/2005 | Shih et al. |
| 2005/0110889 A1 | 5/2005 | Tuttle et al. |
| 2005/0127478 A1 | 6/2005 | Hiatt et al. |
| 2005/0136646 A1 | 6/2005 | Larnerd et al. |
| 2005/0139390 A1 * | 6/2005 | Kim et al. .................. 174/262 |
| 2005/0151228 A1 | 7/2005 | Tanida et al. |
| 2005/0164500 A1 | 7/2005 | Lindgren |
| 2005/0184219 A1 | 8/2005 | Kirby |
| 2005/0191861 A1 | 9/2005 | Verhaverbeke |
| 2005/0194169 A1 | 9/2005 | Tonomura |
| 2005/0231626 A1 | 10/2005 | Tuttle et al. |
| 2005/0236708 A1 | 10/2005 | Farnworth et al. |
| 2005/0247894 A1 | 11/2005 | Watkins et al. |
| 2005/0253213 A1 | 11/2005 | Jiang et al. |
| 2005/0254133 A1 | 11/2005 | Akram et al. |
| 2005/0258530 A1 | 11/2005 | Vindasius et al. |
| 2005/0272221 A1 | 12/2005 | Yen et al. |
| 2005/0275048 A1 | 12/2005 | Farnworth et al. |
| 2005/0275049 A1 | 12/2005 | Kirby et al. |
| 2005/0275051 A1 | 12/2005 | Farnworth et al. |
| 2005/0275750 A1 | 12/2005 | Akram et al. |
| 2005/0277293 A1 | 12/2005 | Kim et al. |
| 2005/0282374 A1 | 12/2005 | Hwang et al. |
| 2005/0285154 A1 | 12/2005 | Akram et al. |
| 2006/0011809 A1 | 1/2006 | Farnworth et al. |
| 2006/0014313 A1 | 1/2006 | Hall et al. |
| 2006/0023107 A1 | 2/2006 | Bolken et al. |
| 2006/0024856 A1 | 2/2006 | Derderian et al. |
| 2006/0035402 A1 | 2/2006 | Street et al. |
| 2006/0035415 A1 | 2/2006 | Wood et al. |
| 2006/0038183 A1 | 2/2006 | Oliver |
| 2006/0038272 A1 | 2/2006 | Edwards |
| 2006/0040421 A1 | 2/2006 | Farnworth et al. |
| 2006/0040428 A1 | 2/2006 | Johnson |
| 2006/0042952 A1 | 3/2006 | Oliver et al. |
| 2006/0043262 A1 | 3/2006 | Akram |
| 2006/0043509 A1 | 3/2006 | Watkins et al. |
| 2006/0043512 A1 | 3/2006 | Oliver et al. |
| 2006/0043569 A1 | 3/2006 | Benson et al. |
| 2006/0043599 A1 | 3/2006 | Akram et al. |
| 2006/0044433 A1 | 3/2006 | Akram |
| 2006/0046332 A1 | 3/2006 | Derderian et al. |
| 2006/0046468 A1 | 3/2006 | Akram et al. |
| 2006/0046471 A1 | 3/2006 | Kirby et al. |
| 2006/0046537 A1 | 3/2006 | Chong et al. |
| 2006/0057776 A1 | 3/2006 | Tao |
| 2006/0057836 A1 | 3/2006 | Nagarajan et al. |
| 2006/0148250 A1 | 7/2006 | Kirby |
| 2006/0151880 A1 | 7/2006 | Tang et al. |
| 2006/0154153 A1 | 7/2006 | Chiang et al. |
| 2006/0160367 A1 | 7/2006 | Wai et al. |
| 2006/0177959 A1 | 8/2006 | Boettiger et al. |
| 2006/0177999 A1 | 8/2006 | Hembree et al. |
| 2006/0180941 A1 | 8/2006 | Kirby et al. |
| 2006/0186097 A1 | 8/2006 | Watkins et al. |
| 2006/0186492 A1 | 8/2006 | Boettiger et al. |
| 2006/0191882 A1 | 8/2006 | Watkins et al. |
| 2006/0199363 A1 | 9/2006 | Kirby et al. |
| 2006/0204651 A1 | 9/2006 | Wai et al. |
| 2006/0208360 A1 | 9/2006 | Yiu et al. |
| 2006/0216862 A1 | 9/2006 | Rigg et al. |
| 2006/0252262 A1 | 11/2006 | Kazemi |
| 2006/0255443 A1 | 11/2006 | Hwang et al. |
| 2006/0264041 A1 | 11/2006 | Rigg et al. |
| 2006/0270108 A1 | 11/2006 | Farnworth et al. |
| 2006/0278980 A1 | 12/2006 | Trezza et al. |
| 2006/0278988 A1 | 12/2006 | Trezza et al. |
| 2006/0281224 A1 | 12/2006 | Edelstein et al. |
| 2006/0281243 A1 | 12/2006 | Trezza |
| 2006/0289968 A1 | 12/2006 | Sulfridge |
| 2006/0290001 A1 | 12/2006 | Sulfridge |
| 2006/0292877 A1 | 12/2006 | Lake |
| 2007/0004079 A1 | 1/2007 | Geefay et al. |
| 2007/0012655 A1 | 1/2007 | Kwon et al. |
| 2007/0020805 A1 | 1/2007 | Kim et al. |
| 2007/0020935 A1 | 1/2007 | Taylor et al. |
| 2007/0023121 A1 | 2/2007 | Jones et al. |
| 2007/0032061 A1 | 2/2007 | Farnworth et al. |
| 2007/0035033 A1 | 2/2007 | Ozguz et al. |
| 2007/0037379 A1 | 2/2007 | Enquist et al. |
| 2007/0042598 A1 | 2/2007 | Park |
| 2007/0045120 A1 | 3/2007 | Tiwari et al. |
| 2007/0045388 A1 | 3/2007 | Farnworth et al. |
| 2007/0045515 A1 | 3/2007 | Farnworth et al. |
| 2007/0045632 A1 | 3/2007 | Oliver et al. |

| | | | |
|---|---|---|---|
| 2007/0045779 | A1 | 3/2007 | Hiatt |
| 2007/0045806 | A1 | 3/2007 | Hsuan |
| 2007/0045812 | A1 | 3/2007 | Heng |
| 2007/0045826 | A1 | 3/2007 | Lee et al. |
| 2007/0045834 | A1 | 3/2007 | Chong et al. |
| 2007/0048896 | A1 | 3/2007 | Andry et al. |
| 2007/0048994 | A1 | 3/2007 | Tuttle |
| 2007/0049016 | A1 | 3/2007 | Hiatt et al. |
| 2007/0049019 | A1 | 3/2007 | Wai et al. |
| 2007/0057028 | A1 | 3/2007 | Lake et al. |
| 2007/0077753 | A1 | 4/2007 | Iwatake et al. |
| 2007/0082427 | A1 | 4/2007 | Shirahama et al. |
| 2007/0096263 | A1 | 5/2007 | Furukawa et al. |
| 2007/0099395 | A1 | 5/2007 | Sridhar et al. |
| 2007/0138562 | A1 | 6/2007 | Trezza |
| 2007/0152342 | A1 | 7/2007 | Tsao et al. |
| 2007/0155997 | A1 | 7/2007 | Li et al. |
| 2007/0158839 | A1 | 7/2007 | Trezza |
| 2007/0158853 | A1 | 7/2007 | Sinha |
| 2007/0161235 | A1 | 7/2007 | Trezza |
| 2007/0166991 | A1 | 7/2007 | Sinha |
| 2007/0166997 | A1 | 7/2007 | Knorr |
| 2007/0167004 | A1 | 7/2007 | Trezza |
| 2007/0170574 | A1 | 7/2007 | Lauxtermann et al. |
| 2007/0178694 | A1 | 8/2007 | Hiatt |
| 2007/0182020 | A1 | 8/2007 | Trezza et al. |
| 2007/0190803 | A1 | 8/2007 | Singh et al. |
| 2007/0197013 | A1 | 8/2007 | Trezza |
| 2007/0202617 | A1 | 8/2007 | Hembree |
| 2007/0222054 | A1 | 9/2007 | Hembree |
| 2007/0228576 | A1 | 10/2007 | Trezza |
| 2007/0228926 | A1 | 10/2007 | Teo et al. |
| 2007/0262424 | A1 | 11/2007 | Hiatt |
| 2007/0281473 | A1 | 12/2007 | Clark et al. |
| 2008/0050911 | A1 | 2/2008 | Borthakur |
| 2008/0054444 | A1 | 3/2008 | Tuttle |
| 2008/0057620 | A1 | 3/2008 | Pratt |

FOREIGN PATENT DOCUMENTS

| | | |
|---|---|---|
| JP | 63052432 | 3/1988 |
| JP | 363052432 A * | 3/1988 |
| JP | 2001077496 A | 3/2001 |
| JP | 2001298147 | 10/2001 |
| JP | 2005093980 | 4/2005 |
| JP | 2005310817 | 11/2005 |
| KR | 20020022122 | 3/2002 |
| KR | 20020061812 | 7/2002 |
| WO | 2005022965 | 3/2005 |
| WO | 2005036940 | 4/2005 |
| WO | 2006053036 | 5/2006 |
| WO | 2006124597 | 11/2006 |
| WO | 2007025812 | 3/2007 |
| WO | 2007043718 | 4/2007 |

OTHER PUBLICATIONS

Aachboun, S. and P. Ranson, "Cryogenic etching of deep narrow trenches in silicon," J. Vac. Sci. Technol. A 18 (4), Jul./Aug. 2000, pp. 1848-1852.

Aachboun, S. and P. Ranson, "Deep anisotropic etching silicon," J. Vac. Sci. Technol. A 17(4), Jul./Aug. 1999, pp. 2270-2273.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp.1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Cheung, T.S.D. et al., "On-ChipInterconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, Jan. 25, 2000, <http://www.smta.org/files/PanPac00-ChouBill.pdf>.

Hirafune, S. et al., "Packaging Technology for Imager Using Through-hole Interconnection in Si Substrate," Proceeding of HDP'04, IEEE, pp. 303-306, Jul. 2004.

Kyocera Corporation, Memory Package, 1 page, Retrieved from the Internet on Dec. 3, 2004, <http://golbal.kyocera.com/prdct/semicon/ic_pkg/memory_p.html>.

Lee, Rex A. et al., "Laser Created Silicon Vias for Stacking Dies in MCMs," IEEE/CHMT IEMT Symposium, 1991, pp. 262-265.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Rasmussen, F.E., et al., "Fabrication of High Aspect Ratio Throu-Wafer Vias in CMOs Wafers for 3-D Packaging Applications," The 12th International Conference on Solid State Sensors, Acutators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Schaper, L. et al., "Integrated System Development for 3-d VLSI," Components and Technology Conference, 2007, ECTC '07, Proceedings, 57th, may 29, 2007 - Jun. 1, 2007, pp. 853-857.

Takahashi, K. et al., "Through Silicon Via and 3-D Wafer/Chip Stacking Technology," 2006 Symposium on VLSI Circuits Digest of Technical Papers.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29, 2007 - Jun. 1, 2007, pp. 643-647.

Trigas, C., "System-In-Package or System-On-Chip ?," EE Times, Sep. 19, 2003, <http://www.eetimes.com/story.OEG20030919S0049>.

Xsil, Via Applications, 1 page, <http://www.xsil.com/viaapplications/index.htm>, retrieved from the Internet on Jul. 22, 2003.

Xsil, Vias for 3Ds Packaging, 1 page, <http://www.xsil.com/viaapplications/3dpackaging/index.htm>, retrieved from the Internet on Jul. 22, 2003.

Xsil, xise200 for vias and micro-maching, <http://www.xsil.com/products/index/html>, retrieved from the Internet on Aug. 16, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Confernce on Micro Electro Mechanical Systems, jan. 2003, ISBN 0-7803-7744-3.

* cited by examiner

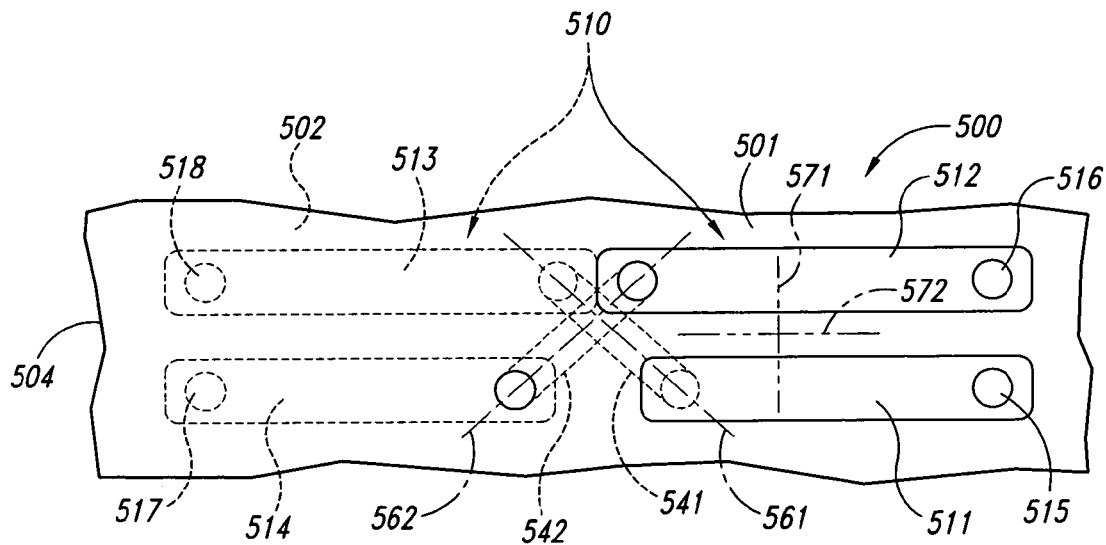
Fig. 5
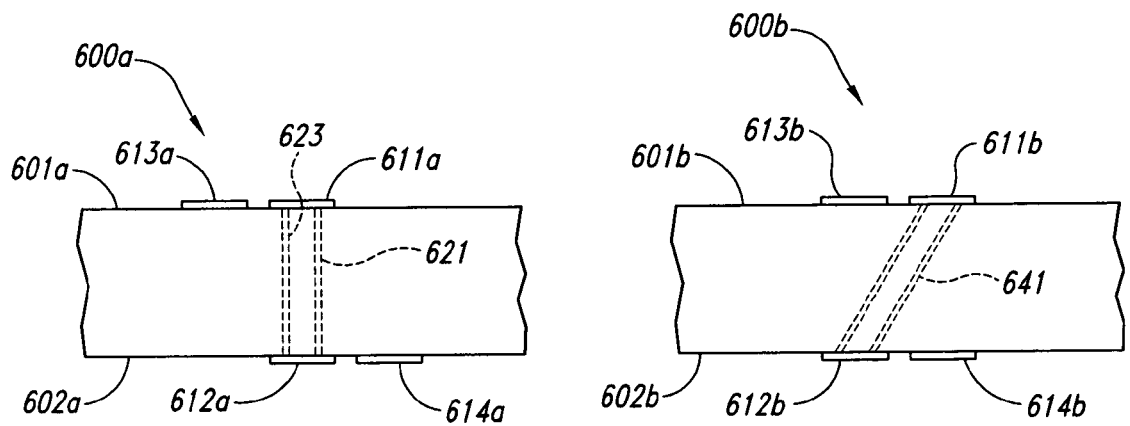
Fig. 6A
(Prior Art)
Fig. 6B

US 7,435,913 B2

SLANTED VIAS FOR ELECTRICAL CIRCUITS ON CIRCUIT BOARDS AND OTHER SUBSTRATES

CROSS-REFERENCE TO RELATED APPLICATIONS

This application is a continuation of U.S. patent application Ser. No. 10/927,760 filed Aug. 27, 2004, now U.S. Pat. No. 7,083,425 which claims foreign priority benefits of Singapore Application No. 200405514-1 filed Aug. 27, 2004, both of which are incorporated herein by reference in their entireties.

TECHNICAL FIELD

The following disclosure relates generally to electrical circuits on circuit boards, microelectronic devices, and other substrates and, more particularly, to conductive vias used with such circuits.

BACKGROUND

Printed circuit boards (PCBs), printed wire boards (PWBs), and similar structures typically include a plurality of conductive lines or traces superimposed or "printed" on one or more sides of a non-conductive substrate. Electronic components can be mounted to the substrate and interconnected by means of wire bonds and/or solder attachments to the conductive lines. FIG. 1, for example, is an isometric view illustrating a portion of a PCB 100 configured in accordance with the prior art. The PCB 100 supports a plurality of electronic components 130 (illustrated schematically in FIG. 1 and identified individually as electronic components 130a-d). The electronic components 130 can include processing devices, routing devices, memory devices and other types of electronic devices typically found on conventional circuit boards in computers, cell phones, personal data assistants, and other electronic products.

The electronic components 130 are mounted to a non-conductive substrate 104 and are interconnected by means of an electrical circuit 110. The electrical circuit 110 includes a first conductive line 111 and a second conductive line 112 disposed on a first surface 101 of the non-conductive substrate 104. The electrical circuit 110 further includes a third conductive line 113 and a fourth conductive line 114 disposed on a second surface 102 of the non-conductive substrate 104 opposite to the first surface 101. The first conductive line 111 is electrically connected to the third conductive line 113 by conductive material 123 in a first passage 121 that extends vertically through the non-conductive substrate 104 from the first conductive line 111 to the third conductive line 113. The second conductive line 112 is similarly connected to the fourth conductive line 114 by conductive material 124 in a second passage 122 that extends vertically through the non-conductive substrate 104 from the second conductive line 112 to the fourth conductive line 114. The passages 121 and 122 are often referred to by those in the art as "plated through-holes" or "vias."

Each of the conductive lines 111-114 includes a corresponding contact or terminal (identified individually as a first terminal 115, a second terminal 116, a third terminal 117, and a fourth terminal 118, respectively). The first electronic component 130a is electrically connected to the first terminal 115 by a wire bond or solder attachment 131 (shown schematically). The second electronic component 130b, the third electronic component 130c, and the fourth electronic component 130d are electrically connected to the second terminal 116, the third terminal 117, and the fourth terminal 118, respectively, in a similar manner.

In the prior art example of FIG. 1, the conductive path between the first terminal 115 and the third terminal 117, and the conductive path between the second terminal 116 and the fourth terminal 118, are relatively straight and direct. In practice, however, it is not uncommon for the paths between two or more pairs of corresponding terminals to cross each other.

FIG. 2 is an isometric view illustrating a portion of a prior art PCB 200 in which the paths between two pairs of corresponding terminals cross each other. Many of the features of the PCB 200 are at least generally similar in structure and function to corresponding features of the PCB 100 described above. For example, the PCB 200 includes the first conductive line 111 and the second conductive line 112 disposed on the first surface 101 of the non-conductive substrate 104. The PCB 200 also includes the first passage 121 and the second passage 122 extending vertically through the non-conductive substrate 104. In contrast to the PCB 100 described above, however, in the example of FIG. 2 the first terminal 115 is electrically connected to the fourth terminal 118, and the second terminal 116 is electrically connected to the third terminal 117.

To accommodate the change in terminals, the PCB 200 includes a third conductive line 213 extending from the first passage 121 to the fourth terminal 118, and a fourth conductive line 214 extending from the second passage 122 to the third terminal 117. As illustrated in FIG. 2, the third and fourth conductive lines 213 and 214 describe somewhat indirect paths between the passages 121 and 122 and the respective terminals. Specifically, the third conductive line 213 jogs away from the third terminal 117 to provide clearance for the fourth conductive line 214, and the fourth conductive line 214 routes around the first passage 121 before proceeding toward the third terminal 117.

There are a number of shortcomings associated with indirect conductive lines such as those described above with reference to FIG. 2. One shortcoming is that the increased line length increases the resistance and inductance in the circuit, thereby increasing the susceptibility to undesirable noise-related effects such as cross-talk. Another shortcoming is that the increased line length can reduce signal strength and increase signal delay. A further shortcoming is the additional material and complexity associated with manufacturing jogged, rather than straight, conductive lines.

BRIEF DESCRIPTION OF THE DRAWINGS

FIG. 5 is a partially hidden top view of an apparatus having slanted vias configured in accordance with another embodiment of the invention.

FIG. 6A is a partially hidden end view of a circuit board having a vertical via configured in accordance with the prior art, and FIG. 6B is a partially hidden end view of a circuit board having a slanted via configured in accordance with an embodiment of the invention.

DETAILED DESCRIPTION

A. Overview

Figure 1:
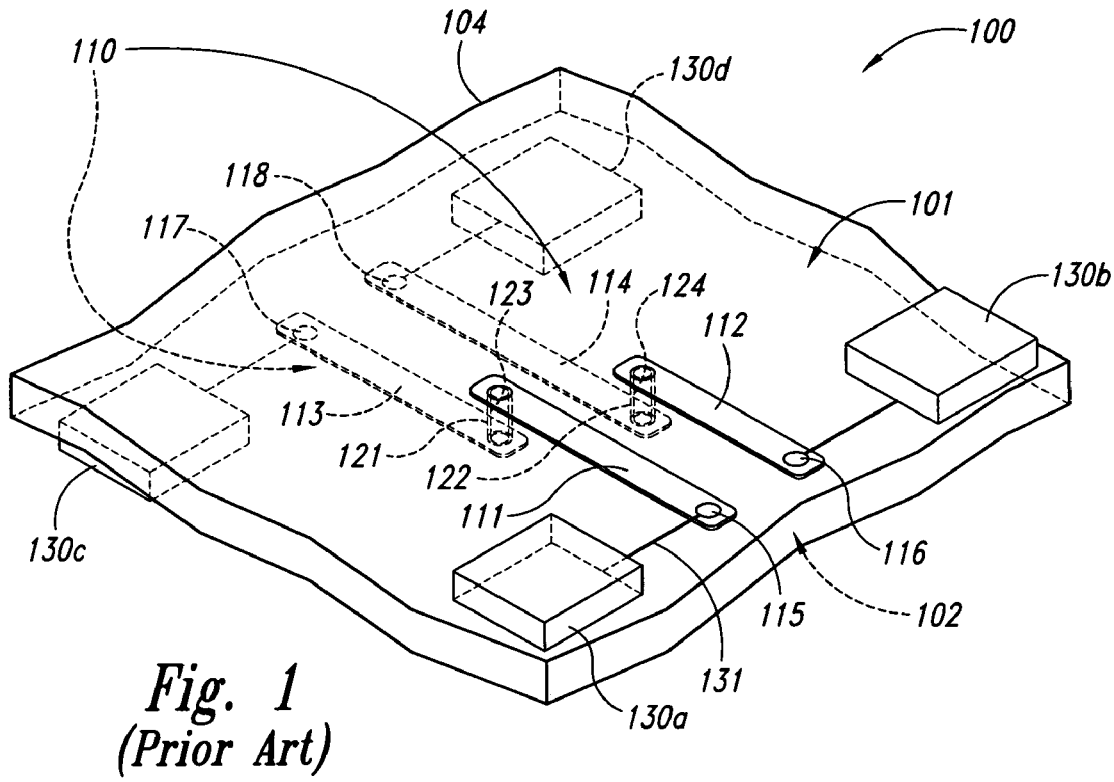
FIG. 1 is a partially schematic isometric view of a portion of a printed circuit board configured in accordance with the prior art.

The following disclosure describes several embodiments of printed circuit boards, printed wiring boards, and other substrates and apparatuses for interconnecting electronic components. One aspect of the invention is directed toward an apparatus for interconnecting electronic components that includes a dielectric portion having a first surface opposite to a second surface. A first terminal is disposed on the first surface of the dielectric portion for connection to a first electronic component. A second terminal is disposed on the second surface of the dielectric portion for connection to a second electronic component. The apparatus further includes a passage extending through the dielectric portion along a longitudinal axis oriented at an oblique angle relative to the first surface. The passage is at least partially filled with conductive material to electrically connect the first terminal to the second terminal.

Another aspect of the invention is directed toward a method for manufacturing an apparatus for interconnecting electronic components. In one embodiment, the method includes forming a first conductive line on a first surface of a dielectric substrate, and forming a second conductive line on a second surface of the dielectric substrate facing opposite to the first surface. The method further includes extending a passage through the dielectric substrate from the first conductive line to the second conductive line, and at least partially filling the passage with conductive material to electrically connect the first conductive line to the second conductive line. In one aspect of this embodiment, the passage extends through the dielectric substrate along a longitudinal axis oriented at an oblique angle relative to the first surface of the dielectric substrate.

Many specific details of the present invention are described below with reference to circuit boards, such as printed circuit boards and printed wiring boards. The present invention, however, is not limited to such structures. Indeed, the terms "dielectric portion," "dielectric substrate," and "non-conductive substrate" as used throughout this disclosure do not refer solely to circuit board structures. To the contrary, these terms refer broadly to other structures upon which and/or in which electrical circuits are formed including, for example, microelectronic devices and packaged microelectronic devices (such as packaged microelectronic devices in stacked-chip and/or flip-chip arrangements). Accordingly, the terms listed above refer not only to circuit board substrates such as composite laminates, but also refer to microelectronic workpieces such as semiconductor wafers (e.g., silicon or gallium arsenide wafers), glass substrates, ceramic substrates, and other types of insulated substrates known to those of ordinary skill in the art.

Specific details of several embodiments of the invention are described below with reference to circuit boards and other apparatuses in order to provide a thorough understanding of such embodiments. Other details describing well-known structures often associated with such apparatuses are not set forth below to avoid unnecessarily obscuring the description of the various embodiments. Those of ordinary skill in the relevant art will understand, however, that the invention may have other embodiments that include other elements in addition to those described below. Alternatively, the invention may have still further embodiments that lack one or more of the elements described below.

In the Figures, identical reference numbers identify identical or at least generally similar elements. To facilitate the discussion of any particular element, the most significant digit or digits of any reference number refer to the Figure in which that element is first introduced. For example, element 310 is first introduced and discussed with reference to FIG. 3.

B. Embodiments of Electrical Circuits Having Slanted Vias

Figure 3:
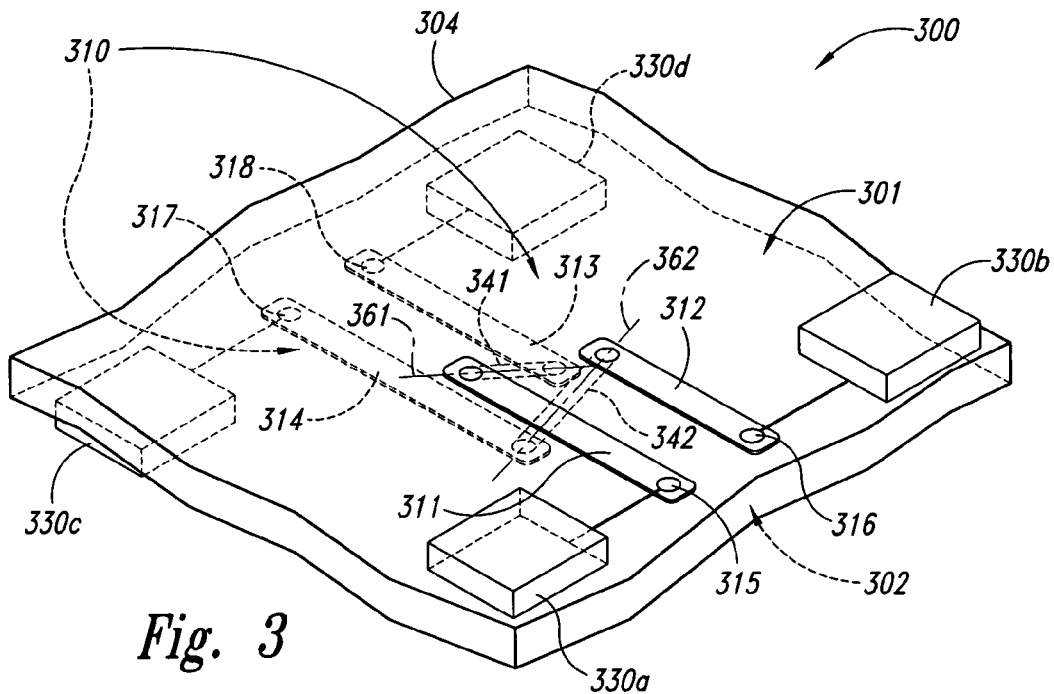
FIG. 3 is a partially schematic isometric view of a portion of an apparatus having slanted vias configured in accordance with an embodiment of the invention.

FIG. 3 is a partially schematic isometric view of a portion of an apparatus 300 having an electrical circuit 310 with slanted vias configured in accordance with an embodiment of the invention. In one embodiment, the apparatus 300 can represent a circuit board, such as a printed circuit board (PCB) or a printed wiring board (PWB). In other embodiments, the apparatus 300 can represent other structures having electrical circuits for interconnecting various types of electronic components. Such structures can include, for example, microelectronic workpieces and packaged microelectronic devices having electrical circuits composed of electrical traces, wire bonds, bond pads, vias, etc., for connecting integrated circuits. In further embodiments, the apparatus 300 can represent yet other structures having electrical circuits.

In the illustrated embodiment, the electrical circuit 310 includes a first conductive line 311 and a second conductive line 312 disposed on a first surface 301 of a non-conductive substrate or dielectric portion 304. The electrical circuit 310 further includes a third conductive line 313 and a fourth conductive line 314 disposed on a second surface 302 of the dielectric portion 304 facing opposite to the first surface 301. A first contact or terminal 315 electrically connects a first electronic component 330a to the first conductive line 311, and a second terminal 316 electrically connects a second electronic component 330b to the second conductive line 312. Similarly, a third terminal 317 electrically connects a third electronic component 330c to the fourth conductive line 314, and a fourth terminal 318 electrically connects a fourth electronic component 330d to the third conductive line 313.

In one aspect of this embodiment, a first slanted via 341 (hereinafter the first "passage" 341) extends through the dielectric portion 304 along a first longitudinal axis 361, and a second slanted via 342 (hereinafter the second "passage" 342) extends through the dielectric portion 304 along a second longitudinal axis 362. The first longitudinal axis 361 intersects the first conductive line 311 and the third conductive line 313, and forms an oblique angle relative to the first surface 301 of the dielectric portion 304. The second longitudinal axis 362 intersects the second conductive line 312 and the fourth conductive line 314, and also forms an oblique angle relative to the first surface 301 of the dielectric portion 304. The first passage 341 is at least partially filled with conductive material 343 to electrically connect the first conductive line 311 to the third conductive line 313. Similarly, the second passage 342 is at least partially filled with conductive material 344 to electrically connect the second conductive line 312 to the fourth conductive line 314.

The apparatus 300 can be manufactured in a number of different ways and with a number of different materials depending on the particular application or the intended use. In a circuit board embodiment, for example, the dielectric portion 304 can include a glass-reinforced polymer laminate (e.g., FR-4) having a copper foil laminated to both the first surface 301 and the second surface 302. The copper foil forms the basis of the conductive lines 311-314. The passages 341 and 342 can be formed through the laminate by mechanical drilling, laser drilling (e.g., "mask image" drilling or "conformal image" drilling), or other suitable methods known in the art.

The passages 341 and 342 are filled with copper to electrically couple (a) the first conductive line 311 to the third conductive line 313, and (b) the second conductive line 312 to the fourth conductive line 314. For example, after the passages 341 and 342 have been formed and cleaned, copper can be electrolessly deposited over the copper foil and onto the inner walls of the passages 341 and 342 to form a seed layer for bulk copper deposition into the passages 341 and 342. The seed layer and copper foil on the first surface 301 and the second surface 302 are then covered with a mask using a suitable image transfer process. The passages 341 and 342 are then filled with a suitable conductive material by electroplating the conductive material on the walls of the passages 341 and 342. The conductive material also plates onto the exposed areas of copper on the first and second surfaces 301 and 302 to form the conductive lines 311-314. The conductive material can include a number of different metals such as copper, tin, lead, etc., known in the art. After electroplating, the mask layer is stripped and the unwanted metallic material on the first and second surfaces 301 and 302 around the conductive lines 311-314 is removed by a suitable process, such as chemical etching. At this point in the manufacturing process, the electronic components 330a -d can be electrically connected to the corresponding terminals 315-318, respectively, using wire bonds, solder connections, or other suitable methods known in the art.

Although the method of manufacturing described above may be suitable for some embodiments of the present invention, other manufacturing processes can be used for other embodiments without departing from the spirit or scope of the present disclosure. For example, in other embodiments of the invention, the apparatus 300 can be a portion of an electronic device, such as a microelectronic device. In a microelectronic device, the dielectric portion 304 can be a portion of a silicon wafer that contains one or more integrated circuits (i.e., a "die" or "chip"). In such embodiments, the slanted vias of the present invention can be used as electrical conduits for connecting two or more dies in, for example, a stacked-chip or flip-chip arrangement. Accordingly, the slanted vias of the present invention are not limited to circuit board applications, but extend to other apparatuses for interconnecting electronic components at both the circuit board and microelectronic device level.

Figure 4A:
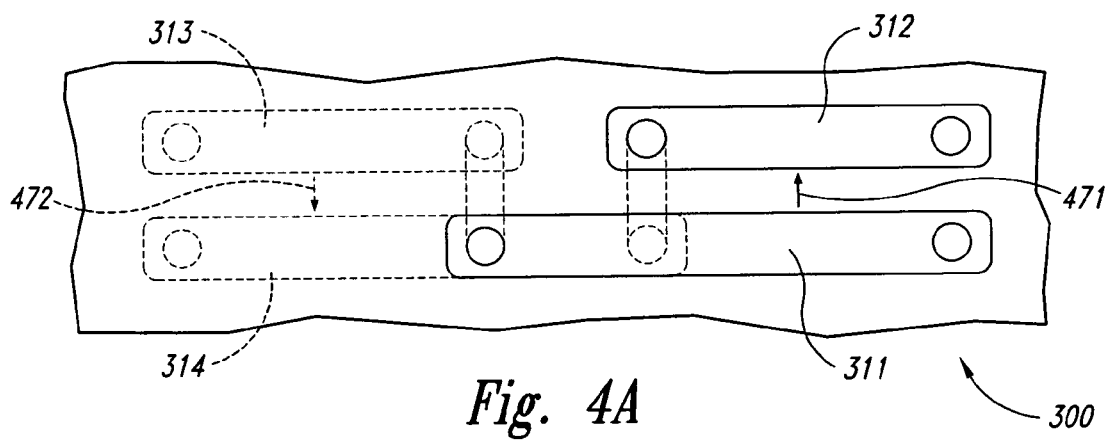
FIG. 4A is a partially hidden top view.
Figure 4B:
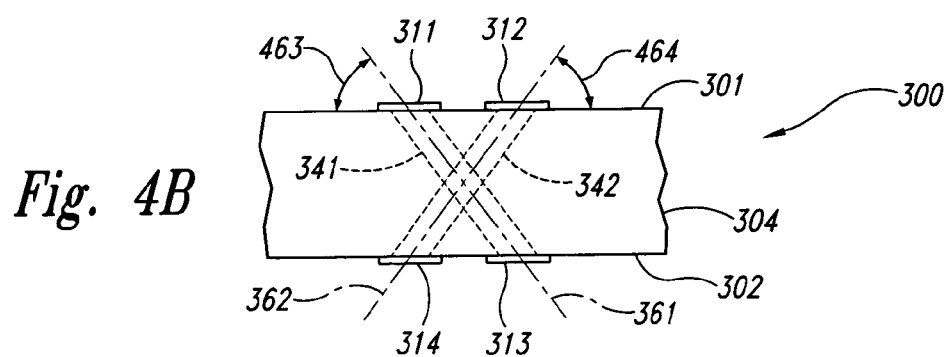
FIG. 4B is a partially hidden end view, of the apparatus of FIG. 3.

FIG. 4A is a partially hidden top view of the apparatus 300 of FIG. 3, and FIG. 4B is a partially hidden end view of the apparatus 300 of FIG. 3, for the purpose of further illustrating the spatial relationships between the various features of the electrical circuit 310. As FIG. 4A illustrates, the second conductive line 312 is offset from the first conductive line 311 in a first direction 471 on the first surface 301 of the dielectric portion 304. The fourth conductive line 314 is offset from the third conductive line 313 on the second surface 302 in a second direction 472 that is opposite to the first direction 471. Further, in the illustrated embodiment the fourth conductive line 314 is at least approximately aligned with the first conductive line 311, and the third conductive line 313 is at least approximately aligned with the second conductive line 312. As FIG. 4B illustrates, the first longitudinal axis 361 of the first passage 341 passes through the first conductive line 311 and the third conductive line 313, and forms a first oblique angle 463 relative to the first surface 301 of the dielectric portion 304. Similarly, the second longitudinal axis 362 of the second passage 342 passes through the second conductive line 312 and the fourth conductive line 314, and forms a second oblique angle 464 relative to the first surface 301 of the dielectric portion 304.

Figure 2:
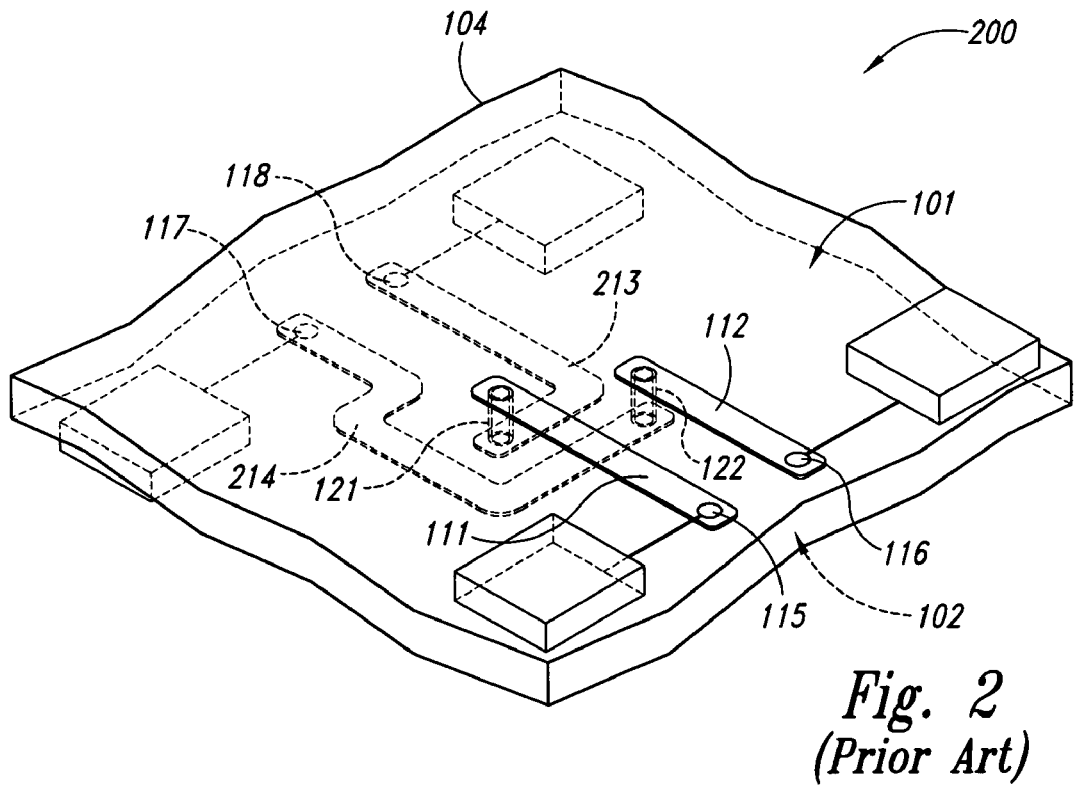
FIG. 2 is a partially schematic isometric view of another printed circuit board configured in accordance with the prior art.

FIGS. 3-4B together illustrate that slanting the passages 341 and 342 enables the third conductive line 313 and the fourth conductive line 314 to be at least generally straight and direct without any jogs. One advantage of this feature over the jogged conductive lines 213 and 214 described above with reference to prior art FIG. 2 is that the direct paths of the present invention can increase processing speed and reduce the electrical resistance and inductance in the circuit, thereby decreasing the susceptibility to undesirable noise-related effects during signal transmission. A further advantage of this feature is that direct paths require less material and are easier to manufacture than jogged paths. In addition, slanted vias offer a useful design alternative when dealing with complicated circuit boards having a large number of conductive lines compressed into a small area.

The spatial arrangements of the features illustrated in FIGS. 3-4B are merely representative of one particular embodiment of the invention. Accordingly, the present invention is not limited to the particular arrangements illustrated in these Figures. To the contrary, the slanted vias of the present invention can be used in a multitude of other electrical circuit arrangements having more or fewer conductive lines, terminals, and/or via elements than those shown in FIGS. 3-4B.

FIG. 5 is a partially hidden top view of an apparatus 500 having an electrical circuit 510 with slanted vias configured in accordance with another embodiment of the invention. Many features of the apparatus 500 are at least generally similar in structure and function to the corresponding features of the apparatus 300 described in detail above with reference to FIGS. 3-4B. For example, the apparatus 500 includes a dielectric portion 504 having a first surface 501 and an opposing second surface 502. A first conductive line 511 is disposed on the first surface 501 adjacent to a second conductive line 512. Similarly, a third conductive line 513 is disposed on the second surface 502 adjacent to a fourth conductive line 514. Each of the conductive lines 511-514 includes a corresponding terminal 515-518, respectively. In the illustrated embodiment, the first conductive line 511 is electrically connected to the third conductive line 513 by a first passage 541 extending through the dielectric portion 504 along a first longitudinal axis 561. Similarly, the second conductive line 512 is electrically connected to the fourth conductive line 514 by a second passage 542 extending through the dielectric portion 504 along a second longitudinal axis 562.

The apparatus 500 of FIG. 5 may offer certain advantages over the apparatus 300 of FIGS. 3-4B because the overall lengths of the conductive paths between the terminals 515 and 518, and between the terminals 516 and 517, are shorter on the apparatus 500. As illustrated in FIG. 5, the paths are shorter because the passages 541 and 542 are not only slanted along a first axis 571 toward the respective conductive lines, but are also slanted along a second axis 572 toward the respective terminals. By slanting the passages 541 and 542 in this manner, the conductive paths can be further shortened over the embodiment illustrated in FIGS. 3-4B. Accordingly, those of ordinary skill in the art will appreciate that the various different slant angles can be incorporated into a particular circuit design without departing from the spirit or scope of the present disclosure. The choice of slant angle will depend on the particular application and the particular design constraints.

FIG. 6A is a partially hidden end view of an apparatus 600a configured in accordance with the prior art, and FIG. 6B is a partially hidden end view of an apparatus 600b configured in accordance with an embodiment of the present invention. Together, FIGS. 6A-B illustrate the flexibility offered by slanted vias from a design perspective. Referring first to FIG. 6A, the prior art apparatus 600a includes a first conductive line 611a electrically connected to a second conductive line 612a by a vertical passage 621 at least partially filled with a conductive material 623. The apparatus 600a further includes a third conductive line 613a positioned adjacent to the first conductive line 611a, and a fourth conductive line 614a positioned adjacent to the second conductive line 612a. As FIG. 6A illustrates, the vertical passage 621 precludes positioning the fourth conductive line 614a directly beneath the first conductive line 611a, and positioning the third conductive line 613a directly above the second conductive line 612a, should either of those positions be desired.

Referring next to FIG. 6B, the apparatus 600b configured in accordance with the present invention includes a first conductive line 611b electrically connected to a second conductive line 612b by a slanted passage 641 at least partially filled with conductive material 643. As FIG. 6B illustrates, slanting the passage 641 enables a fourth conductive line 614b to be positioned directly beneath the first conductive line 611b, and a third conductive line 613b to be positioned directly above the second conductive line 612b, should either of those positions be desired. Further, slanting the passage 641 enables a more efficient arrangement of the four conductive lines 611b-614b because together they consume a narrower section of the apparatus 600b than the four conductive lines 611a-614a consume of the apparatus 600a.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. An apparatus for interconnecting electronic components, the apparatus comprising:
   a dielectric portion having a first surface opposite to a second surface, wherein the dielectric portion carries an integrated circuit;
   a first passage formed through the dielectric portion along a first longitudinal axis oriented at an oblique angle relative to the first surface, wherein the first passage is at least partially filled with a first portion of conductive material after forming;
   a second passage formed through the dielectric portion along a second longitudinal axis that is non-parallel to the first longitudinal axis, wherein the second longitudinal axis is oriented at an oblique angle relative to the first surface of the dielectric portion, and wherein the second passage is at least partially filled with a second portion of conductive material after forming;
   a first terminal disposed on the first surface of the dielectric portion and electrically connected to the integrated circuit;
   a second terminal disposed on the second surface of the dielectric portion, wherein the first portion of conductive material at least partially filling the first passage electrically connects the first terminal to the second terminal;
   a third terminal disposed on the first surface of the dielectric portion, wherein the third terminal is offset from the first terminal in a first direction; and
   a fourth terminal disposed on the second surface of the dielectric portion, wherein the fourth terminal is offset from the second terminal in a second direction opposite to the first direction, and wherein the second portion of conductive material at least partially filling the second passage electrically connects the third terminal to the fourth terminal.

2. The apparatus of claim 1 wherein
   the first terminal is disposed on the first surface of the dielectric portion for connection to a first electronic component, and
   the second terminal disposed on the second surface of the dielectric portion for connection to a second electronic component.

3. The apparatus of claim 1 wherein the first terminal is disposed on the first surface of the dielectric portion at a first end of the first passage for connection to a first electronic component, and the second terminal is disposed on the second surface of the dielectric portion at a second end of the first passage for connection to a second electronic component.

4. The apparatus of claim 1 further comprising:
   a bond pad disposed on the first surface of the dielectric portion and electrically connected to the integrated circuit,
   wherein the first portion of conductive material at least partially filling the first passage electrically connects the bond pad to the second terminal.

5. The apparatus of claim 1 comprising:
   a bond pad disposed on the first surface of the electric portion and electrically connected to the integrated circuit,
   wherein the first portion of conductive material at least partially filling the first passage electrically connects the bond pad to the second terminal; and
   a microelectronic die electrically connected to the second terminal.

6. The apparatus of claim 1 wherein
   the first terminal is disposed on the first surface of the dielectric portion for connection to a first electronic component, and
   the second terminal disposed on the second surface of the dielectric portion for connection to a second electronic component, and wherein the apparatus further comprises:
   a first conductive line disposed on the first surface of the dielectric portion and connecting the first terminal to the first portion of conductive material in the first passage; and
   a second conductive line disposed on the second surface of the dielectric portion and connecting the second terminal to the first portion of conductive material in the first passage.

7. The apparatus of claim 1, further comprising:
   a first conductive line disposed on the first surface of the dielectric portion and connecting the first terminal to the first portion of conductive material in the first passage;
   a second conductive line disposed on the second surface of the dielectric portion and connecting the second terminal to the first portion of conductive material in the first passage;
   a third conductive line disposed on the first surface of the dielectric portion and connecting the third terminal to the second portion of conductive material in the second passage; and a fourth conductive line disposed on the second surface of the dielectric portion and connecting the fourth terminal to the second portion of conductive material in the second passage.

8. The apparatus of claim 1, further comprising:

a first conductive line disposed on the first surface of the dielectric portion and connecting the first terminal to the first portion of conductive material in the first passage;

a second conductive line disposed on the second surface of the dielectric portion and connecting the second terminal to the first portion of conductive material in the first passage;

a third conductive line disposed on the first surface of the dielectric portion in alignment with the second conductive line, wherein the third conductive line connects the third terminal to the second portion of conductive material in the second passage; and a fourth conductive line disposed on the second surface of the dielectric portion in alignment with the first conductive line, wherein the fourth conductive line connects the fourth terminal to the second portion of conductive material in the second passage.

9. An apparatus for interconnecting electronic components, the apparatus comprising:

a non-conductive portion having a first surface facing opposite to a second surface;

a first passage formed through the non-conductive portion at a first oblique angle relative to the first surface of the non-conductive portion;

a first portion of conductive material at least partially filling the first passage after forming the first passage;

a second passage formed through the non-conductive portion, wherein the second passage is non-parallel to the first passage, and wherein the second passage is formed through the non-conductive portion at a second oblique angle relative to the first surface of the non-conductive portion;

a second portion of conductive material at least partially filling the second passage after forming the second passage;

first means disposed on the first surface of the non-conductive portion for electrically connecting the first portion of conductive material to a first electronic component;

second means disposed on the second surface of the non-conductive portion for electrically connecting the first portion of conductive material to a second electronic component;

third means disposed on the first surface of the non-conductive portion for electrically connecting the second portion of conductive material to a third electronic component, wherein the third means is offset from the first means in a first direction; and fourth means disposed on the second surface of the non-conductive portion for electrically connecting the second portion of conductive material to a fourth electronic component, wherein the fourth means is offset from the second means in a second direction opposite to the first direction.

10. The apparatus of claim 9 wherein the second means is laterally offset from the first means, and wherein the first portion of conductive material directly connects the first means on the first surface to the second means on the second surface.

11. The apparatus of claim 9 wherein the first means include a first conductive line disposed on the first surface of the non-conductive portion, wherein the second means include a second conductive line disposed on the second surface of the non-conductive portion, and wherein the first conductive line is vertically misaligned relative to the second conductive line.

12. The apparatus of claim 9 wherein the non-conductive portion includes a silicon substrate.

13. The apparatus of claim 9 wherein the non-conductive portion includes a fiber-reinforced substrate.

14. The apparatus of claim 9 wherein the first means include a first conductive line disposed on the first surface of the non-conductive portion, wherein the second means include a second conductive line disposed on the second surface of the non-conductive portion, wherein the third means include a third conductive line disposed on the first surface of the non-conductive portion in alignment with the second conductive line, and wherein the fourth means include a fourth conductive line disposed on the second surface of the non-conductive portion in alignment with the first conductive line.

* * * * *